(12) United States Patent
Marin et al.

(10) Patent No.: US 11,296,186 B2
(45) Date of Patent: Apr. 5, 2022

(54) PACKAGE-INTEGRATED VERTICAL CAPACITORS AND METHODS OF ASSEMBLING SAME

(71) Applicant: Intel Corporation, Santa Clara, CA (US)

(72) Inventors: Brandon C Marin, Chandler, AZ (US); Praneeth Akkinepally, Tempe, AZ (US); Whitney Bryks, Chandler, AZ (US); Dilan Seneviratne, Chandler, AZ (US); Frank Truong, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/737,680

(22) Filed: Jan. 8, 2020

(65) Prior Publication Data

US 2020/0144359 A1    May 7, 2020

Related U.S. Application Data

(63) Continuation of application No. 16/024,223, filed on Jun. 29, 2018, now Pat. No. 10,546,916.

(51) Int. Cl.
*H01L 23/532* (2006.01)
*H01L 49/02* (2006.01)
(Continued)

(52) U.S. Cl.
CPC .......... *H01L 28/60* (2013.01); *H01L 21/7687* (2013.01); *H01L 23/5329* (2013.01);
(Continued)

(58) Field of Classification Search
CPC ......... H01L 28/40; H01L 28/60; H01L 29/00; H01L 29/92; H01L 29/4236; H01L 29/66181; H01L 29/945; H01L 27/101; H01L 27/0652; H01L 27/0755; H01L 27/0658; H01L 27/0716; H01L 27/10829;
(Continued)

(56) References Cited

U.S. PATENT DOCUMENTS 5,218,566 A * 6/1993 Papaliolios ............. G11C 11/22
365/145
6,657,849 B1 * 12/2003 Andresakis ............ H05K 1/162
361/303

(Continued)

OTHER PUBLICATIONS

"Application Serial No. 16 024,223, Restriction Requirement mailed Apr. 5, 19", 7 pgs.

(Continued)

*Primary Examiner* — Chuong A Luu
(74) *Attorney, Agent, or Firm* — Schwegman Lundberg & Woessner, P.A.

(57) ABSTRACT

Disclosed embodiments include in-recess fabricated vertical capacitor cells, that can be assembled as close to the surface of a semiconductor package substrate as the first-level interconnect surface. The in-recess fabricated vertical capacitor cells are semiconductor package-integrated capacitors. Disclosed embodiments include laminated vertical capacitor cells where a plated through-hole is twice breached to form opposing capacitor plates. The breached, plated through-hole capacitors are semiconductor package-integrated capacitors.

12 Claims, 8 Drawing Sheets

(51) Int. Cl.
*H01L 21/768* (2006.01)
*H01L 23/00* (2006.01)

(52) U.S. Cl.
CPC ........ *H01L 24/48* (2013.01); *H01L 21/76874* (2013.01); *H01L 2924/186* (2013.01); *H01L 2924/19041* (2013.01)

(58) Field of Classification Search
CPC ......... H01L 27/10861; H01L 27/10838; H01L 27/0805; H01L 27/0629; H01L 27/0682; H01L 21/768; H01L 21/7687; H01L 21/76874; H01L 2924/186; H01L 2924/19041; H01L 28/92; H01L 28/55; H01L 28/57; H01L 28/65; H01L 28/75; H01L 28/82; H01L 28/84; H01L 28/90; H01L 29/93; H01L 2924/1205
USPC ...................................................... 257/532
See application file for complete search history.

(56) References Cited

U.S. PATENT DOCUMENTS

| | | | |
|---|---|---|---|
| 10,546,916 | B2 | 1/2020 | Marin et al. |
| 2005/0064681 | A1 | 3/2005 | Wood et al. |
| 2007/0034989 | A1* | 2/2007 | Shioga .................... H01L 28/65 257/532 |
| 2009/0268510 | A1* | 10/2009 | Barth, Jr. .......... H01L 27/10897 365/149 |
| 2011/0168374 | A1* | 7/2011 | Watanabe .......... H05K 7/20418 165/185 |
| 2016/0020267 | A1* | 1/2016 | Lin ....................... H01L 29/945 257/532 |
| 2016/0087030 | A1 | 3/2016 | Robutel |
| 2016/0190143 | A1* | 6/2016 | Chuang ............... H01L 27/0629 257/326 |
| 2020/0006468 | A1 | 1/2020 | Marin et al. |

OTHER PUBLICATIONS

"Application Serial No. 16 024,223, Response filed May 9, 19 to Restriction Requirement mailed Apr. 5, 19", 9 pgs.

"Application Serial No. 16 024,223, Non Final Office Action mailed May 31, 19", 10 pgs.

"Application Serial No. 16 024,223, Response filed Jul. 17, 19 to Non-Final Office Action mailed May 31, 19", 6 pgs.

"Application Serial No. 16 024,223, Notice of Allowance mailed Sep. 20, 19".

Chen, W, "Heterogeneous Integration for loT Cloud and Smart Things: A Roadmap for the future", 3D-PEIM Symposium, (2016), 15 pgs.

Ghaffarian, "BOK for NASA Electronic Packaging Roadmap", JPL Publications, (2015), 55 pgs.

U.S. Appl. No. 16/024,223, U.S. Pat. No. 10,546,916, filed Jun. 29, 2018, Package-Integrated Vertical Capacitors and Methods of Assembling Same.

* cited by examiner

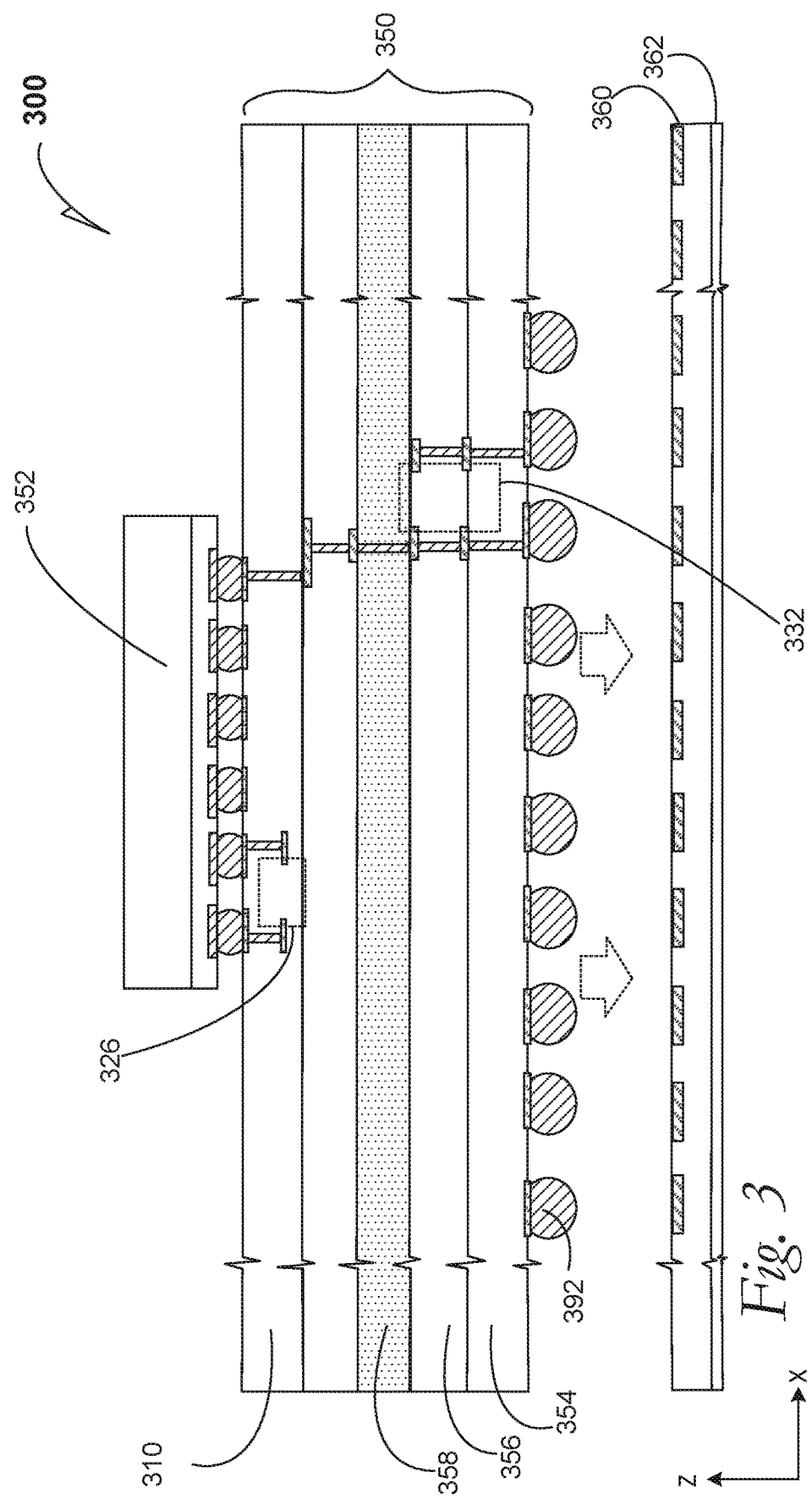

US 11,296,186 B2

PACKAGE-INTEGRATED VERTICAL CAPACITORS AND METHODS OF ASSEMBLING SAME

PRIORITY APPLICATION

This application is a continuation of U.S. application Ser. No. 16/024,223, filed Jun. 29, 2018, which is incorporated herein by reference in its entirety.

FIELD

This disclosure relates to power delivery for semiconductor device packages.

BACKGROUND

Semiconductive device miniaturization connected to device packaging, includes challenges to fit sufficient capacitors near semiconductive devices, while competing for space on semiconductor package substrates.

BRIEF DESCRIPTION OF THE DRAWINGS

Disclosed embodiments are illustrated by way of example, and not by way of limitation, in the figures of the accompanying drawings where like reference numerals may refer to similar elements, in which:

FIG. 3 is a cross-section elevation schematic of a semiconductor device package that includes several semiconductor package-integrated capacitor cell embodiments;

DETAILED DESCRIPTION

Disclosed embodiments include in-recess fabricated and package-integral vertical capacitor cells, that can be assembled as close to the surface of a semiconductor package substrate as the first-level interconnect (FLI) surface.

Disclosed embodiments include right-cylinder vertical capacitor cells where a plated through-hole is twice breached to form opposing capacitor plates. The breached, plated right-cylinder capacitors are package-integrated capacitors.

Figure 1A:
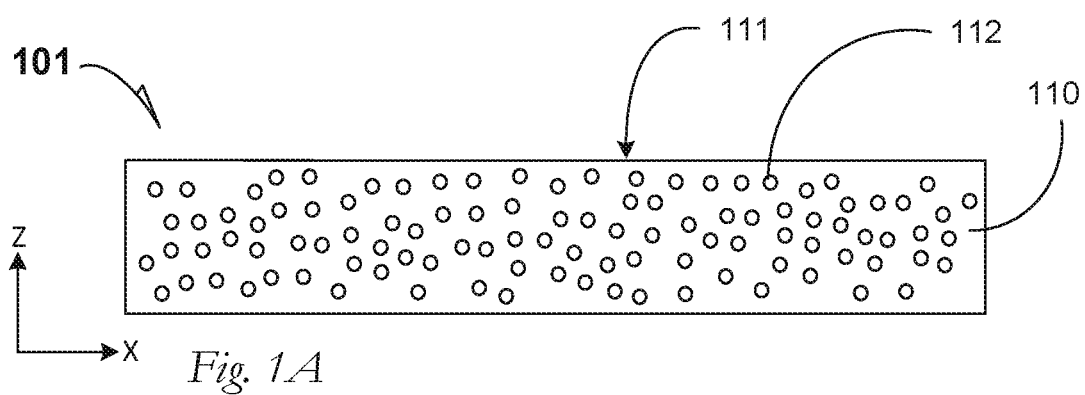
FIG. 1A is a cross-section elevation of a semiconductor package substrate during fabrication of a package-embedded vertical capacitor cell according to an embodiment

FIG. 1A is a cross-section elevation of a semiconductor package substrate 101 during fabrication of a package-embedded vertical capacitor cell according to an embodiment. A semiconductor package substrate portion 110 is the topmost part of a semiconductor package substrate, such as the outermost interlayer dielectric on the die side of a semiconductor package substrate in an embodiment. In an embodiment, the semiconductor package substrate portion 110 is the bottommost part of a semiconductor package substrate, such as the outer-most interlayer dielectric on the land side of a semiconductor package substrate in an embodiment. In an embodiment, the semiconductor package substrate portion 110 is an intermediate part of a semiconductor package substrate, such as between the land side and the die side of a semiconductor package substrate.

In an embodiment, the semiconductor package substrate 102 includes a high-permittivity (high-K) filler material 112 within the semiconductor package substrate portion 110, where the filler material 112 also functions as a catalyst for electroless deposition. In an embodiment, the filler material 112 occupies the semiconductor package substrate portion 110 up to 60 volume percent.

In an embodiment, the filler material 112 is alumina ($Al_2O_3$). In an embodiment, the filler material 112 is a non-stoichiometric solid solution of alumina ($Al_xO_y$). In an embodiment, the filler material 112 is a lead titanium zirconate ($PbTi_{1-x}Zr_xO_3$). In an embodiment, the filler material 112 is a non-stoichiometric solid solution of lead titanium zirconate. In an embodiment, the filler material 112 is lithium niobate ($LiNbO_3$). In an embodiment, the filler material 112 is a non-stoichiometric solid solution of lithium niobite ($Li_xNb_yO_3$). In an embodiment, the filler material 112 is a strontium titanate ($SrTiO_3$). In an embodiment, the filler material 112 is a non-stoichiometric solid solution of strontium titanate ($Sr_xTi_yO_3$). In an embodiment, the filler material 112 is strontium zirconate ($SrZrO_3$). In an embodiment, the filler material 112 is a non-solid solution of strontium zirconate ($Sr_xZr_yO_3$). In an embodiment, the filler material 112 is aluminum nitride (AlN). In an embodiment, the filler material 112 is a non-stoichiometric solid solution of aluminum nitride ($Al_xN_y$).

In an embodiment, a combination of any two above materials is used. In an embodiment, a combination of any three of the above materials. In an embodiment other compounds are used as the filler material 112.

Figure 1B:
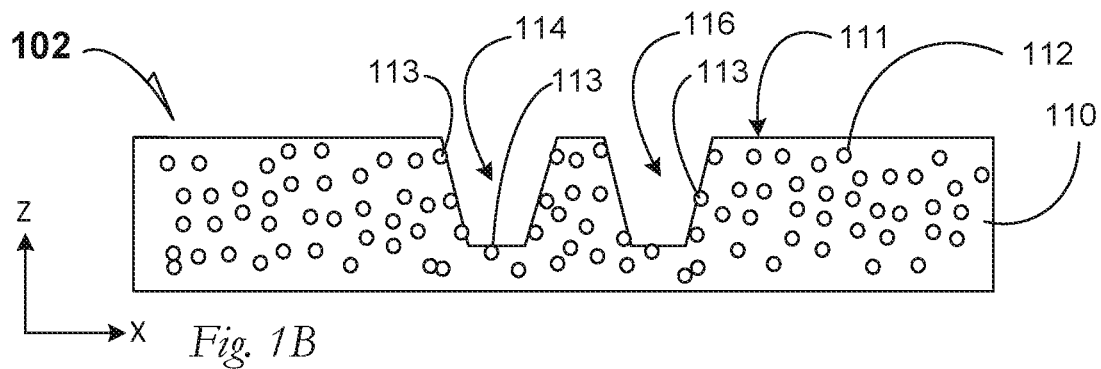
FIG. 1B is a cross-section elevation of the semiconductor package substrate depicted in FIG. 1A after further processing according to an embodiment.

FIG. 1B is a cross-section elevation of the semiconductor package substrate 101 depicted in FIG. 1A after further processing according to an embodiment. In an embodiment, processing is done on the semiconductor package substrate 102 at a top surface 111 to open a first recess 114, and an adjacent second recess 116. The first recess 114 and the adjacent second recess 116 are formed as substantially parallel troughs 114 and 116, where the long dimension of the troughs 114 and 116 run orthogonal to the plane of the drawings, in the Y-direction.

In an embodiment, a laser drill is used to ablate through the top surface 111, to form a laser-drilled characteristic tapered recess shape, and to expose several of the filler material 112, such that exposed filler material is designated with reference number 113. In an embodiment, the process of laser drilling activates exposed portions of the exposed filler material 113 such that the exposed filler material 113 act as catalyst sites for electroless plating within the recesses 114 and 116.

Figure 1C:
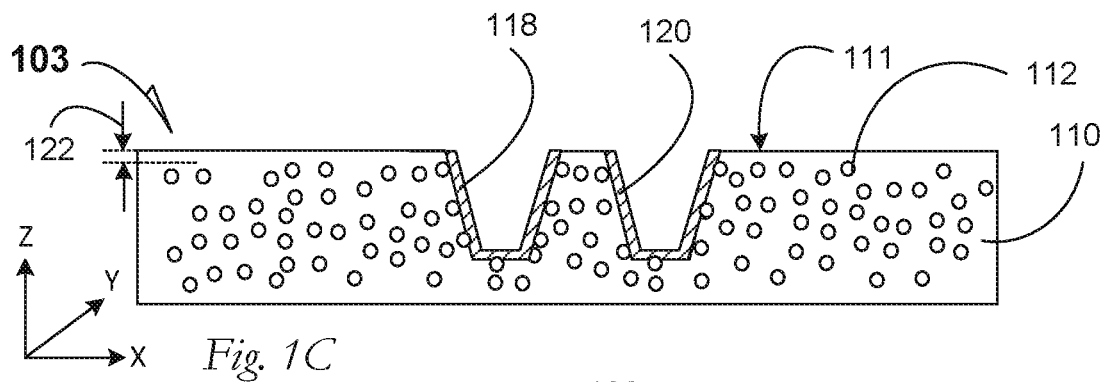
FIG. 1C is a cross-section elevation of the semiconductor package substrate depicted in FIG. 1B after further processing according to an embodiment.

FIG. 1C is a cross-section elevation of the semiconductor package substrate 102 depicted in FIG. 1B after further processing according to an embodiment. In an embodiment, processing is done on the semiconductor package substrate 103 to plate metal 118 into the first recess 114, and also metal 120 into the adjacent second recess 116. In an embodiment, a first recess plating 118 is formed in the first recess 114, and an adjacent second plating 120 is formed in the adjacent second recess 116.

In an embodiment, essentially no electroless plating occurs on the top surface 111. In an embodiment a neutral zone 122 includes the top surface 111. The neutral zone 122 resists electroplating because essentially no exposed filler material 113 is present to catalyze electroless plating. In an embodiment, the neutral zone 122 is formed such as by a lacquer coating (not pictured) that blinds off any of the filler material 112 at the top surface 111. In an embodiment, the neutral zone 122 is formed when the dielectric material of the semiconductor package substrate portion 110 is green enough to allow upper particles of the filler material 112 to sink under at least one G. In an embodiment, the semiconductor package substrate portion 110 is accelerated under more than one G, such that although the particles 112 may behave in the Stokes Regime, or the green semiconductor package substrate portion 110 behaves as a non-Neutonian liquid, sufficient that the neutral zone 122 is formed.

In an embodiment, electroless plating is achieved, limited to within the recesses 114 and 116.

Figure 1D:
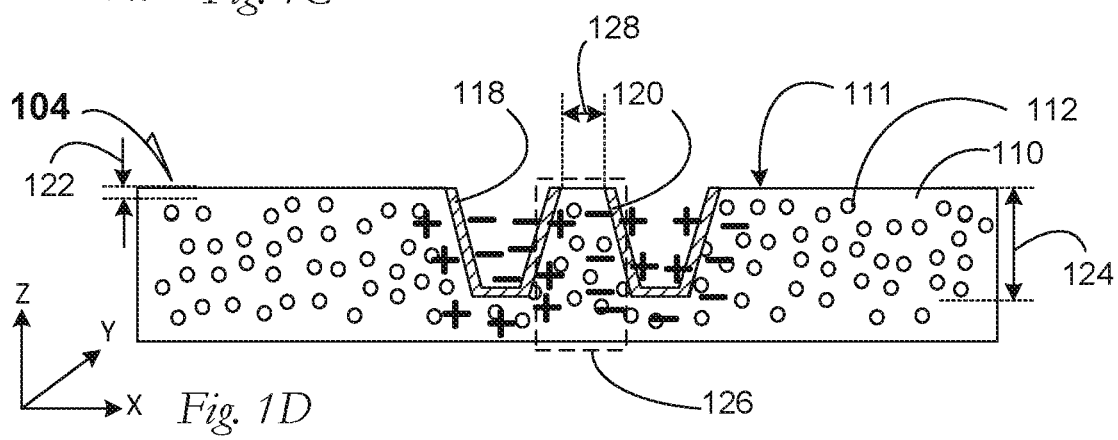
FIG. 1D is a cross-section elevation of the semiconductor package substrate depicted in FIG. 1C after further processing and during use according to several embodiments.

FIG. 1D is a cross-section elevation of the semiconductor package substrate 103 depicted in FIG. 1C after further processing and during use according to several embodiments.

In an embodiment, the first recess plating 118 and the adjacent subsequent recess plating 120 (adjacent and second plated recess) form a capacitive zone 126 with a metal 118 insulator 128 metal 120 (MIM) cell 126. The capacitive zone 126 includes adjacent portions of the two recess platings 118 and 120, where portions of adjacent trough walls 118 and 120 are presented as non-parallel planar electrodes. "Non-parallel planar" means the adjacent walls of the adjacent trough plates 118 and 120 are not parallel planar; they are each presented at an angle that is less than 89° with respect to the X-direction.

In an embodiment, processing is done on the semiconductor package substrate 104, where the first recess plating 118 (first plated recess) has a cell length (not illustrated), in the Y-direction in a range from 25 micrometer (μm) to 100 μm. In an embodiment, recess plating 118 covers a cell length that is 50 μm in the Y-direction. In an embodiment, the first recess plating 118 penetrates to first recess depth 124 in a range from 15 μm to 45 μm. In an embodiment, the first recess plating 118 penetrates to first recess depth 124 of 30 μm.

In an embodiment, the first recess plating 118 and the adjacent subsequent recess plating 120 (adjacent and second plated recess) form a capacitive zone 126 with a metal 118 insulator 128 metal 120 (MIM) cell 126. In an embodiment, the insulator 128 is an integral and homogenous region of the semiconductor package substrate portion 110. In an embodiment, the MIM cell 126 is spaced apart 128 by the dielectric material of the semiconductor package substrate portion 110, in a range from 5 μm to 15 μm.

In an embodiment, the package-integrated vertical capacitor cell 126 is spaced apart 128 by the dielectric material of the semiconductor package substrate portion 110, by 10 μm. In an embodiment, the recess depth 124 is 30 μm, the package-integrated vertical capacitor cell 126 is spaced apart 128 by 10 μm, and the cell length in the Y-direction (not illustrated) is 50 μm. In an embodiment, a package-integrated vertical capacitor MIM cell 126 can generate a capacitance up to 10.5 $\mu F/cm^2$.

In an embodiment, laser drilling is controlled to achieve less tapered recesses in order to approach a substantially vertical walls of two adjacent non-parallel planar trough electrodes that approach a parallel-plate capacitor cell. Laser-drilling techniques to achieve a useful minimum taper are used.

In an embodiment, a package-integrated vertical capacitor cell 126 is clustered within a semiconductor package substrate portion 110 in a range from 10 to 40 package-integrated vertical capacitor cells within a square centimeter. In an embodiment, a package-integrated vertical capacitor cell 126 is clustered within a semiconductor package substrate portion 110 in a range from 20 to 30 MIM cells within a square centimeter.

Figure 2A:
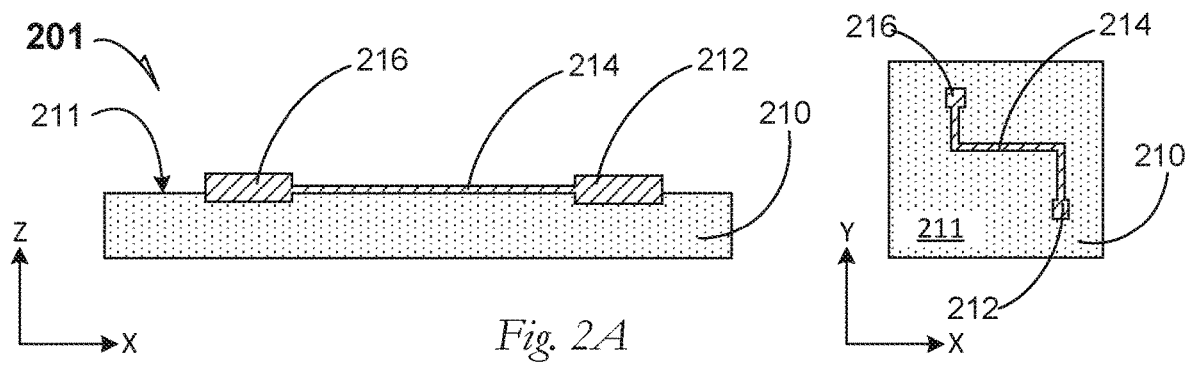
FIG. 2A is cross-section elevation and projection and a top plan of a semiconductor package substrate during fabrication of a package-embedded vertical capacitor cell according to an embodiment.

FIG. 2A is cross-section elevation projection and a top plan of a semiconductor package substrate 201 during fabrication of a package-embedded vertical capacitor cell according to an embodiment. In an embodiment, a semiconductor package substrate portion 210 has a top surface 211 onto which a first contact 212, a trace 214 and a second contact 216 are formed. In an embodiment, semi-additive plating (SAP) techniques are used to form the first contact 212, the trace 214 and the second contact 216. The cross-section elevation projection that is X-Z designated, is seen in projection to show both electrodes in the top plan that is X-Y designated.

In these embodiments laminated vertical capacitor cells are disclosed, where a plated recess is twice breached to form opposing capacitor plates. The twice-breached, plated through-hole capacitors are semiconductor package-integrated capacitors.

A semiconductor package substrate portion 210 is near the topmost part of a semiconductor package substrate, such as near the outermost interlayer dielectric on the die side of a semiconductor package substrate in an embodiment. In an embodiment, the semiconductor package substrate portion 210 is the bottommost part of a semiconductor package substrate, such as the outermost interlayer dielectric on the land side of a semiconductor package substrate in an embodiment. In an embodiment, the semiconductor package substrate portion 210 is an intermediate part of a semiconductor package substrate, such as between the land side and the die side of a semiconductor package substrate.

In the X-Y representation, the trace 214 takes a non-linear path between the first contact 212 and the second contact 214.

Figure 2B:
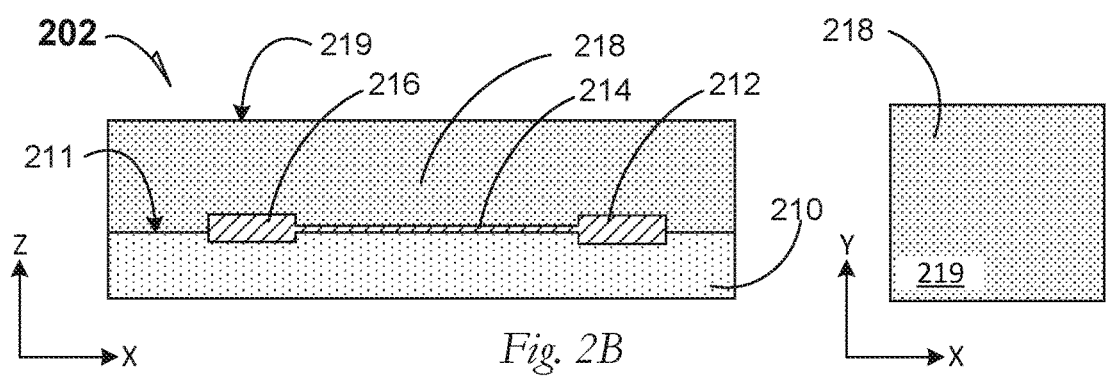
FIG. 2B is cross-section elevation and projection and a top plan of the semiconductor package substrate depicted in FIG. 2A after further fabrication of the package-embedded vertical capacitor cell according to an embodiment.

FIG. 2B is cross-section elevation projection and a top plan of the semiconductor package substrate 201 depicted in FIG. 2A after further fabrication of the package-embedded vertical capacitor cell according to an embodiment. In an embodiment, a top interlayer dielectric layer (IDL) 218 is formed on the semiconductor package substrate portion 210 at the top surface 211, and it is also formed over the first contact 212, the trace 214 and the second contact 216. The top plan that is X-Y designated, shows the top IDL 218 having blinded off the top surface 211, the contacts 212 and 214 and the trace 214. The top IDL 218 has a top IDL top surface 219.

Figure 2C:
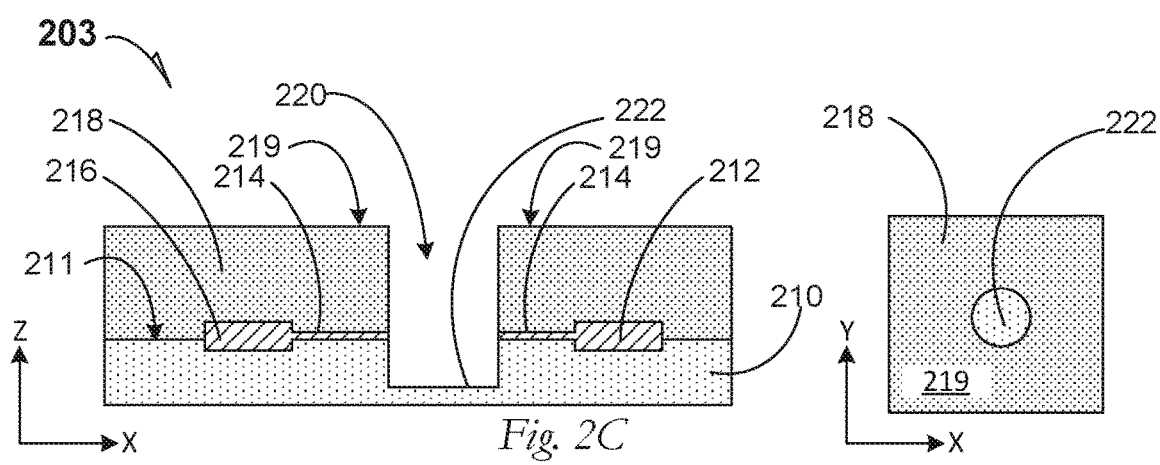
FIG. 2C is cross-section elevation and projection and a top plan of the semiconductor package substrate depicted in FIG. 2B after further fabrication of the package-embedded vertical capacitor cell according to an embodiment.

FIG. 2C is cross-section elevation and projection and a top plan of the semiconductor package substrate 202 depicted in FIG. 2B after further fabrication of the package-embedded vertical capacitor cell according to an embodiment. In an embodiment, the top surface 219 of the top IDL 218 has been opened by a drilling process to form a capacitor cell recess 220. In an embodiment, drilling is done with a laser drill to form the capacitor cell recess 220. In an embodiment, drilling is done with a mechanical drill to form the capacitor cell recess 220.

The capacitor cell recess 220 is formed to penetrate through the top IDL 218, to partially penetrate the semiconductor package substrate portion 210, and to breach the trace 214 such that breached ends of the trace 214 are exposed within the capacitor cell recess 220. Further, formation of the capacitor cell recess 220 forms a capacitor cell floor 222 that exists within the semiconductor package substrate portion 210.

In the X-Y representation of the semiconductor package substrate 203, the trace 214 is blinded off, the IDL top surface 219 is breached, and the capacitor cell floor 222 is exposed.

Figure 2D:
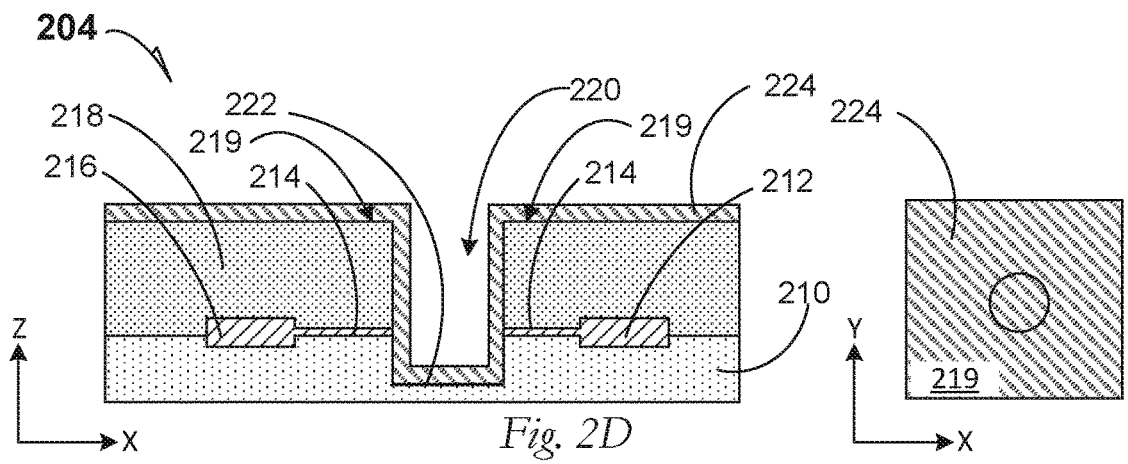
FIG. 2D is cross-section elevation projection and a top plan of the semiconductor package substrate depicted in FIG. 2C after further fabrication of the package-embedded vertical capacitor cell according to an embodiment.

FIG. 2D is cross-section elevation projection and a top plan of the semiconductor package substrate 203 depicted in FIG. 2C after further fabrication of the package-embedded vertical capacitor cell according to an embodiment. In an embodiment, the top surface 219 of the top IDL 218 has been overlaid by a capacitor-cell electrode material 224, and the capacitor-cell electrode material 224 has also been plated into the capacitor cell recess 220, to both cover the capacitor cell floor 222 as to contact the trace 214 at each continuation where the trace 214 contacts the first contact 212 as well as the trace 214 contacts the second contact 216.

In the X-Y representation of the semiconductor package substrate 204, although the capacitor-cell electrode material 224 covers all structures, the residual of the capacitor cell recess 220 is depicted by a circular edge.

Figure 2E:
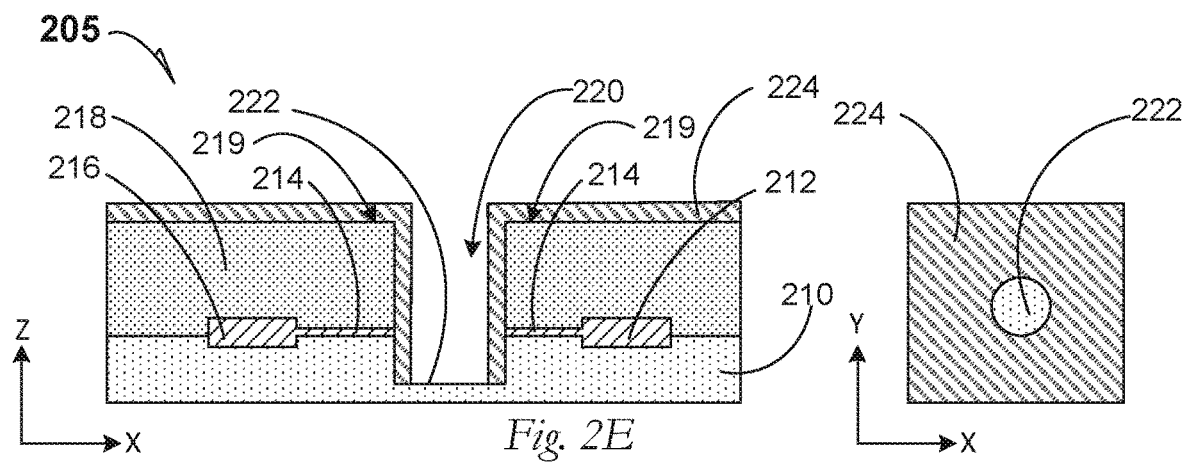
FIG. 2E is cross-section elevation projection and a top plan of the semiconductor package substrate depicted in FIG. 2D after further fabrication of the package-embedded vertical capacitor cell according to an embodiment.

FIG. 2E is cross-section elevation projection and a top plan of the semiconductor package substrate 204 depicted in FIG. 2D after further fabrication of the package-embedded vertical capacitor cell according to an embodiment. In an embodiment, the capacitor-cell electrode material 224 has been removed at the capacitor cell floor 222 to begin to separate the capacitor-cell electrode material into two non-shorting capacitor plates. In an embodiment, removal of the capacitor cell electrode material 224 within the capacitor cell recess 220 is done by a directional etch that protects the vertical aspects of the capacitor cell electrode material within the capacitor cell recess. Such directional etching is done by patterning a mask and using an anisotropic etch technique. In an embodiment, removal of selected capacitor-cell electrode material 224 is done by a mechanical drilling technique.

In the X-Y representation of the semiconductor package substrate 205, although the capacitor-cell electrode material 224 covers almost all structures, the capacitor cell floor 222 is again exposed.

Figure 2F:
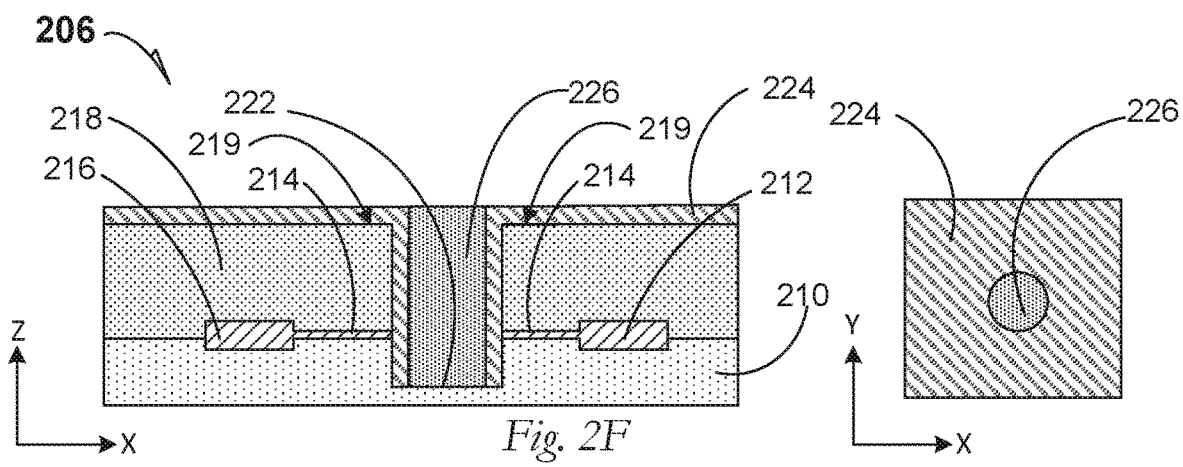
FIG. 2F is cross-section elevation projection and a top plan of the semiconductor package substrate depicted in FIG. 2E after further fabrication of the package-embedded vertical capacitor cell according to an embodiment.

FIG. 2F is cross-section elevation projection and a top plan of the semiconductor package substrate 205 depicted in FIG. 2E after further fabrication of the package-embedded vertical capacitor cell according to an embodiment. In an embodiment, the capacitor-cell recess 220 (see FIG. 2E) has been filled with a high-permittivity (high-K) dielectric material 226, such that a plug 226 contacts the vertical portion of the electrode material 224 within the capacitor-cell recess 220.

In the X-Y representation of the semiconductor package substrate 206, the plug 226 is seen filling the capacitor-cell recess 220.

Figure 2G:
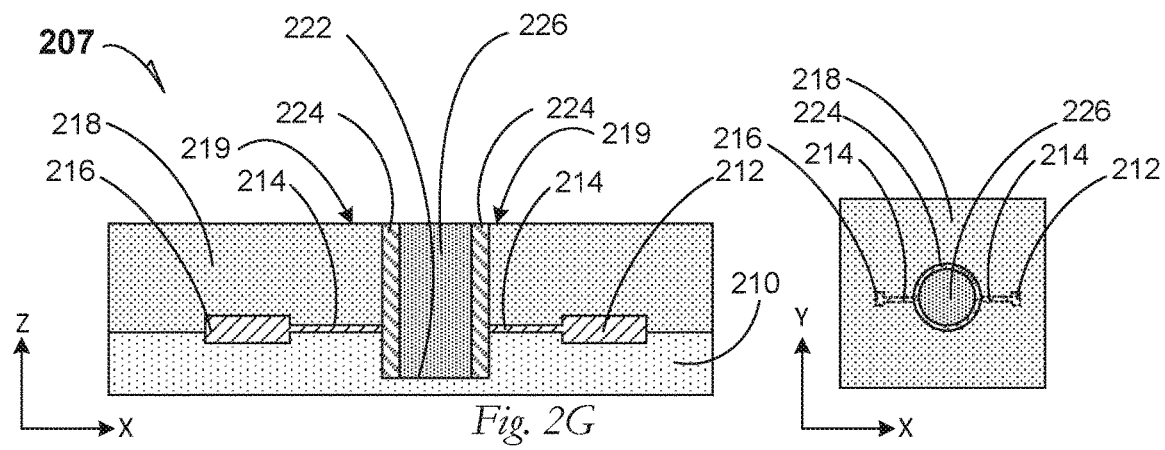
FIG. 2G is cross-section elevation and projection and a top plan of the semiconductor package substrate depicted in FIG. 2F after further fabrication of the package-embedded vertical capacitor cell according to an embodiment.

FIG. 2G is cross-section elevation projection and a top plan of the semiconductor package substrate 206 depicted in FIG. 2F after further fabrication of the package-embedded vertical capacitor cell according to an embodiment. In an embodiment, a flash etching technique has removed all the horizontally exposed portions of the electrode material 224 to leave only the vertical portion 224 within the capacitor-cell recess 220.

In the X-Y representation of the semiconductor package substrate 207, the first and second electrodes 212 and 214, as well as the two trace segments 214 are depicted in ghosted lines as they are blinded off by the top IDL 218. Further, the plug 226 is seen filling the capacitor-cell recess but the electrode material 224 is also seen as an annulus structure.

Figure 2H:
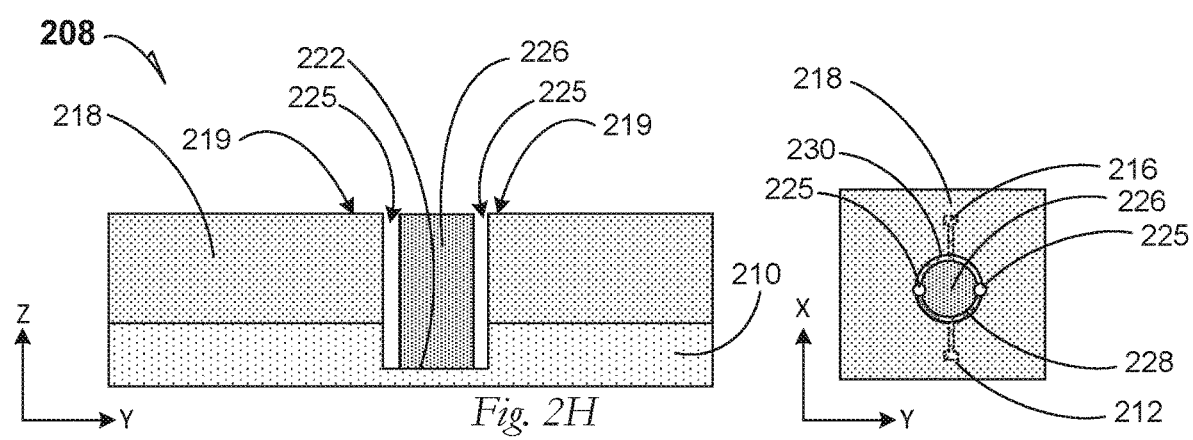
FIG. 2H is cross-section elevation and a top plan of the semiconductor package substrate depicted in FIG. 2G after further fabrication of the package-embedded vertical capacitor cell according to an embodiment.

FIG. 2H is cross-section elevation and a top plan of the semiconductor package substrate 207 depicted in FIG. 2G after further fabrication of the package-embedded vertical capacitor cell according to an embodiment. By comparison to the images depicted in FIG. 2G, the images depicted in FIG. 2H are rotated one-quarter around the Z-axis. Consequently, where the cross-section elevation in FIG. 2G is X-Z oriented, the cross-section elevation in FIG. 2H is Y-Z oriented. Similarly, where the top plan in FIG. 2G shows an X-Y orientation with the Y-direction vertically, in FIG. 2H, the top plan is a Y-X orientation with the X-direction shown vertically.

Processing includes breaching the electrode material 224 as seen in FIG. 2G with the X-Y orientation, to create electrode breaches 225 as seen in FIG. 2H in the Y-Z orientation. As seen in the Y-X orientation, a first capacitor plate 228 is a partial right cylinder. The first capacitor plate 228 is derived from the remaining electrode material depicted in FIG. 2G. The first capacitor plate 228 is coupled to the first electrode 212. Similarly, a second capacitor plate 230 is a partial right cylinder. The second capacitor plate 230 is derived from the remaining electrode material 224 depicted in FIG. 2G. The second capacitor plate 230 is coupled to the second electrode 216.

Figure 2K:
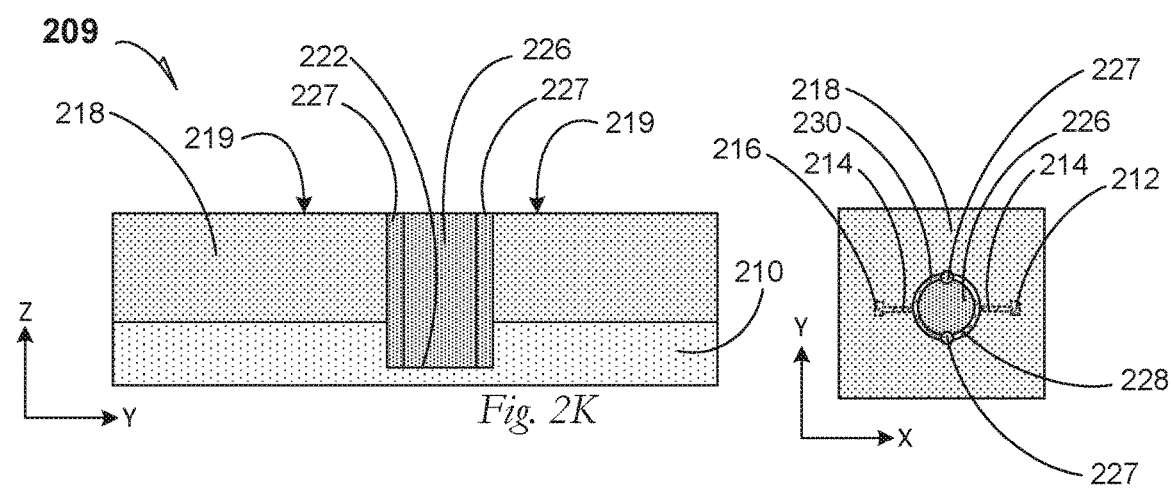
FIG. 2K is cross-section elevation and a top plan of the semiconductor package substrate depicted in FIG. 2H after further fabrication of the package-embedded vertical capacitor cell according to an embodiment.

FIG. 2K is cross-section elevation and a top plan of the semiconductor package substrate 208 depicted in FIG. 2H after further fabrication of the package-embedded vertical capacitor cell according to an embodiment. Items 2I and 2J are omitted.

The cross-section elevation orientation is the same as in FIG. 2H, and the top plan is the restored X-Y orientation as seen in FIG. 2G.

Processing includes filling the electrode breaches 225 with a breach plug material 227 such as a high-permittivity composition. In an embodiment, the same material as the plug 226 is used to fill the electrode breaches 225.

As seen in the X-Y orientation, the first capacitor plate 228 and second capacitor plate 230 are isolated across the plug 226 and the breach plug material 227.

Figure 2M:
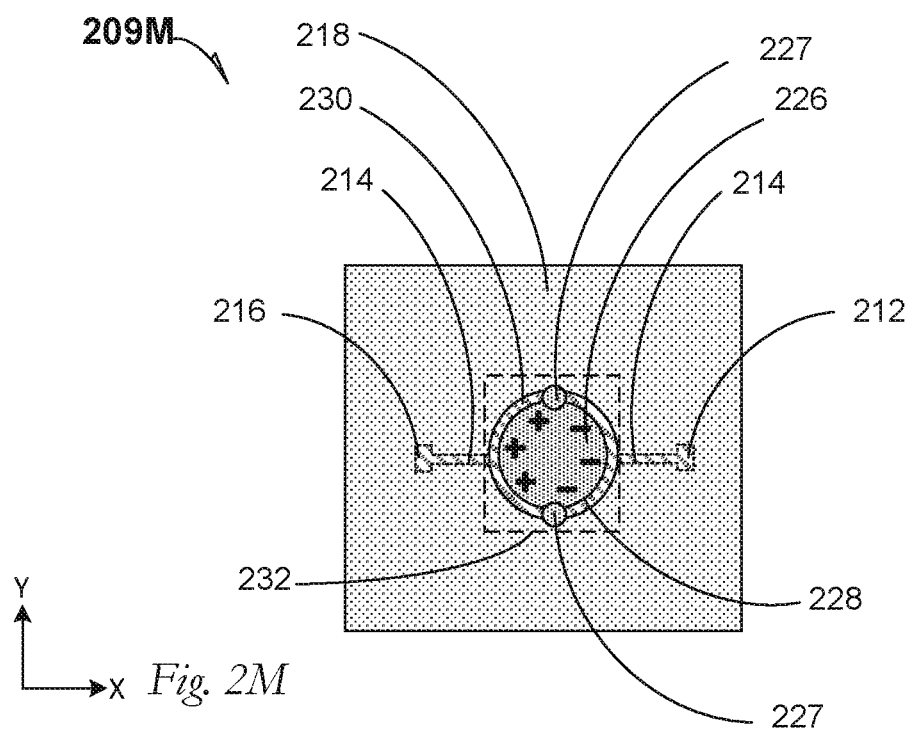
FIG. 2M is a top plan of the of the semiconductor package substrate depicted in FIG. 2H during capacitive operation according to an embodiment.

FIG. 2M is a top plan of the of the semiconductor package substrate 208 depicted in FIG. 2K during capacitive operation according to an embodiment. Item 2L is omitted.

The semiconductor package substrate 209M shows the first capacitor plate 228, the plug 226, breach plug material 227 and the second capacitor plate 230 to form a capacitive zone 232 with a metal 228 insulator 226, 227 and metal 230 (MIM) cell 232. Although a parallel-plate, MIM capacitor may provide a higher capacitive build-up and discharge, the respective first and second capacitor plates 228 and 230 are portions of right-cylindrical plates. In an embodiment, the semiconductor package-integrated capacitor cell 232 can generate a capacitance up to 1.44 $\mu F/cm^2$.

Figure 2N:
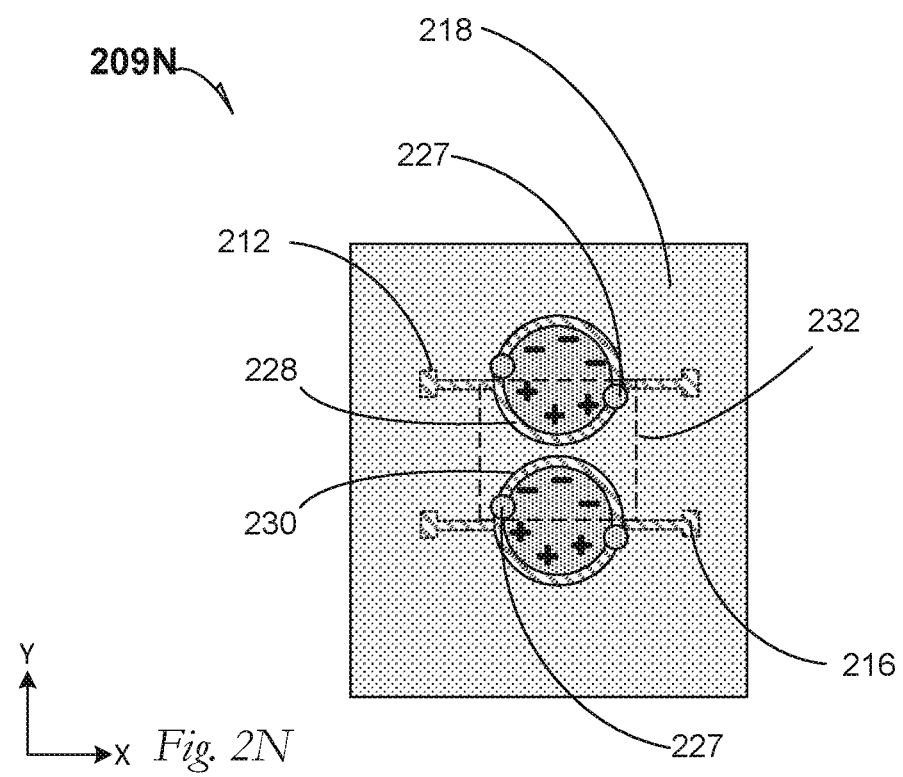
FIG. 2N is a top plan of the of a semiconductor package substrate that includes more than one breached cylinder according to an embodiment.

FIG. 2N is a top plan of the of a semiconductor package substrate 209N that includes more than one breached cylinder according to an embodiment.

In an embodiment, the first capacitor plate 228, the plug 226, a plug-breach material 227 are part of a first right-cylinder structure. The adjacent second capacitor plate 230 forms a capacitive zone 232 with the first capacitor plate 228 but the insulator material is the bulk of the top IDL 218 and any part of the capacitor plates are inserted into the semiconductor package substrate portion 210. In this embodiment, discharge initiates primarily across the top IDL 218, whereas with the capacitor cell 232 depicted in FIG. 2M, initiates primarily across the breach plug material 227. Consequently, in FIG. 2N the capacitor cell 232 is a metal 228 insulator 218 and 210, and metal 230 (MIM) cell 232. The capacitor cell 232 includes capacitor plates 228 and 232 that are two adjacent breached right cylinders. In an embodiment, the semiconductor package-integrated capacitor cell 232 can generate a capacitance up to 10.5 $\mu F/cm^2$.

In an embodiment, where the semiconductor package-integrated capacitor cell 232 depicted in FIG. 2N is a semiconductor package-integrated capacitor cell embodiment, assembly of more than one such MIM cell embodiment is done by linearly arranging more than two breached right cylinders. Whereas the semiconductor package-integrated capacitor cell embodiment in FIG. 2N uses two capacitor plates 228 and 230 and does not use two other plates at the ends (50% use), three in-line breached right-cylinder structures use four capacitor plates and do not use two other plates at the ends (66.7% use). Further, four in-line breached capacitor plates use six capacitor plates and do not use two other plates at the ends (75% use). Further, five in-line breached capacitor plates use eight capacitor plates and do not use two other plates at the ends (80% use).

FIG. 3 is a cross-section elevation schematic of a semiconductor device package 300 that includes several semiconductor package-integrated capacitor cell embodiments.

In an embodiment, where the semiconductor package-integrated capacitor cell 126 depicted in FIG. 1D is a semiconductor package-integrated capacitor cell embodiment, assembly of more than one such semiconductor package-integrated capacitor cell embodiment is done by stacking more than one semiconductor package substrate portions such as two semiconductor package substrate portions 110 with vertically aligned and connected semiconductor package-integrated capacitor cell embodiments, to essentially double capacitive-charge delivery without increasing an enlarged-footprint within a given semiconductor package substrate 350. In an embodiment, more than two such semiconductor package-integrated capacitor cell embodiments are vertically aligned and connected.

In an embodiment, where the semiconductor package-integrated capacitor cell 332 depicted in FIG. 2M is a semiconductor package-integrated capacitor cell embodiment, assembly of more than one such MIM cell embodiment is done by stacking more than one semiconductor package substrate portions such as two semiconductor package substrate portions 210 with vertically aligned and connected semiconductor package-integrated capacitor cell embodiments, to essentially double capacitive-charge delivery without increasing an enlarged-footprint within a given semiconductor package substrate. In an embodiment, more than two such MIM cell embodiments 232 are vertically aligned and connected.

In an embodiment, more than two such MIM cell embodiments 232 depicted in FIG. 2N are vertically aligned and connected.

In an embodiment, a die-side semiconductor package substrate portion 310 is the topmost part of the semiconductor package substrate 350. A first semiconductive device 352 is flip-chip mounted on the semiconductor package substrate 350 at the die-side semiconductor package substrate portion 310. In an embodiment, at least one semiconductor package-integrated capacitor cell 326 such as the semiconductor package-integrated capacitor cell 126 depicted in FIG. 1D is contained within the die-side semiconductor package substrate portion 310. In an embodiment, multiple semiconductor package-integrated capacitor cells are within the designated region 326 include in a range from two to about 50 cells/$cm^2$.

In an embodiment, the die-side semiconductor package substrate portion 310 contains at least one semiconductor package-integrated capacitor cell 326 such as the semiconductor package-integrated capacitor cell 232 depicted in FIG. 2M is contained within the die-side semiconductor package substrate portion 310. In an embodiment, multiple semiconductor package-integrated capacitor cells are within the designated region 326 include in a range from two to about 50 cells/$cm^2$.

In an embodiment, the die-side semiconductor package substrate portion 310 contains at least one semiconductor package-integrated capacitor cell 326 such as the semiconductor package-integrated capacitor cell 232 depicted in FIG. 2N is contained within the die-side semiconductor package substrate portion 310. In an embodiment, multiple semiconductor package-integrated capacitor cells are within the designated region 326 include in a range from two to about 50 cells/$cm^2$.

In an embodiment, a land-side semiconductor package substrate portion 354 is the bottommost part of the semiconductor package substrate 350. In an embodiment, at least one semiconductor package-integrated capacitor cell 332 such as the semiconductor package-integrated capacitor cell 232 depicted in FIG. 1D is contained within the land-side semiconductor package substrate portion 356.

In an embodiment, at least one semiconductor package-integrated capacitor cell 332 such as the semiconductor package-integrated capacitor cell 232 depicted in FIG. 2M is contained within the land-side semiconductor package substrate portion 356. Additionally, in an embodiment, the semiconductor package-integrated capacitor cell 332 includes at least two vertically-stacked integrated capacitors; one capacitor in the land-side semiconductor package substrate portion 354, and one capacitor in a penultimate land-side semiconductor package substrate portion 356.

Additionally, wiring to the semiconductor device 352 passes through a core 358 if present, and is further wired to couple with the semiconductor device 352. In an embodiment, multiple semiconductor package-integrated capacitor cells are within the designated region 332 including in a range from two to about 50 cells/cm² per semiconductive package substrate portion 354 and 356.

In an embodiment, the land-side semiconductor package substrate portion 354 contains at least one semiconductor package-integrated capacitor cell 332 such as the semiconductor package-integrated capacitor cell 126 depicted in FIG. 1D is contained within the land-side semiconductor package substrate portion 356. In an embodiment, multiple semiconductor package-integrated capacitor cells are within the designated region 354 include in a range from two to about 50 cells/cm².

In an embodiment, at least one semiconductor package-integrated capacitor cell is used in a computing system and the computing system that includes a board 360 such as a motherboard 360. In an embodiment, the board 360 includes a shell 362 that provides both physical and dielectric protection to the semiconductive device 352, which is coupled to at least one semiconductor package-integrated capacitor cell.

Figure 4:
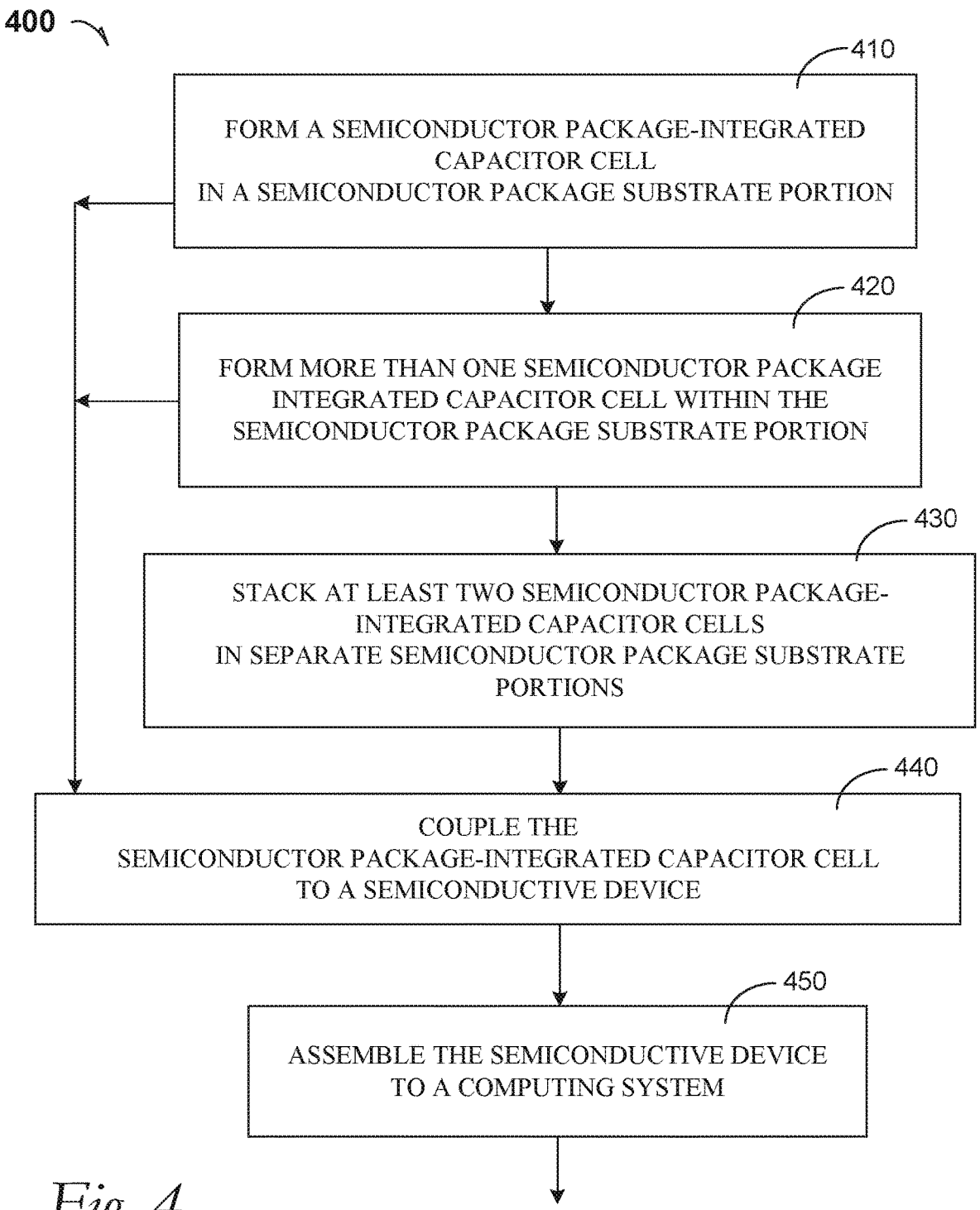
FIG. 4 is a process flow diagram according to several embodiments.

FIG. 4 is a process flow diagram according to several embodiments.

At 410, the process includes forming a semiconductor package-integrated capacitor cell in a semiconductor package substrate portion.

At 420, the process includes forming more than one semiconductor package-integrated capacitor cell within the semiconductor package substrate portion.

At 430, the process includes stacking two semiconductor package-integrated capacitor cells within separate semiconductor package substrate portions.

At 440, the process includes coupling the semiconductor package-integrated capacitor cell to a semiconductive device.

At 450, the process includes assembling the semiconductive device to a computing system.

Figure 5:
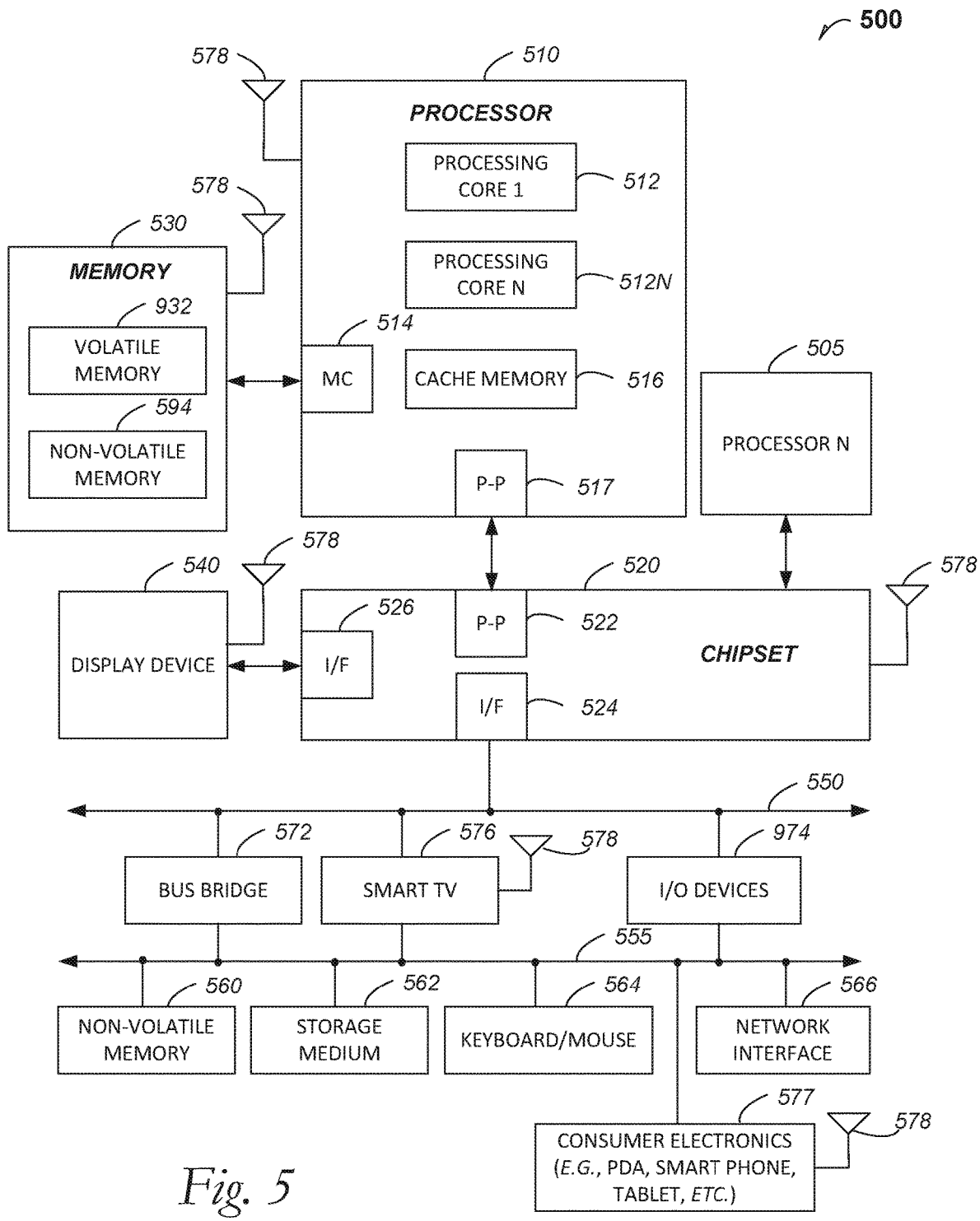
FIG. 5 is included to show an example of a higher-level device application for the disclosed embodiments.

FIG. 5 is included to show an example of a higher-level device application for the disclosed embodiments. The semiconductor package-integrated capacitor cell embodiments may be found in several parts of a computing system. In an embodiment, the semiconductor package-integrated capacitor cell embodiments can be part of a communications apparatus such as is affixed to a cellular communications tower. In an embodiment, a computing system 500 includes, but is not limited to, a desktop computer. In an embodiment, a computing system 500 includes, but is not limited to a laptop computer. In an embodiment, a computing system 500 includes, but is not limited to a tablet. In an embodiment, a computing system 500 includes, but is not limited to a notebook computer. In an embodiment, a computing system 500 includes, but is not limited to a personal digital assistant (PDA). In an embodiment, a computing system 500 includes, but is not limited to a server. In an embodiment, a computing system 500 includes, but is not limited to a workstation. In an embodiment, a computing system 500 includes, but is not limited to a cellular telephone. In an embodiment, a computing system 500 includes, but is not limited to a mobile computing device. In an embodiment, a computing system 500 includes, but is not limited to a smart phone. In an embodiment, a system 500 includes, but is not limited to an internet appliance. Other types of computing devices may be configured with the microelectronic device that includes semiconductor package-integrated capacitor cell embodiments.

In an embodiment, the processor 510 has one or more processing cores 512 and 512N, where 512N represents the Nth processor core inside processor 510 where N is a positive integer. In an embodiment, the electronic device system 500 using a semiconductor package-integrated capacitor cell embodiment that includes multiple processors including 510 and 505, where the processor 505 has logic similar or identical to the logic of the processor 510. In an embodiment, the processing core 512 includes, but is not limited to, pre-fetch logic to fetch instructions, decode logic to decode the instructions, execution logic to execute instructions and the like. In an embodiment, the processor 510 has a cache memory 516 to cache at least one of instructions and data for the multi-layer solder resist on a semiconductor device package substrate in the system 500. The cache memory 516 may be organized into a hierarchal structure including one or more levels of cache memory.

In an embodiment, the processor 510 includes a memory controller 514, which is operable to perform functions that enable the processor 510 to access and communicate with memory 530 that includes at least one of a volatile memory 532 and a non-volatile memory 534. In an embodiment, the processor 510 is coupled with memory 530 and chipset 520. In an embodiment, the chipset 520 is part of a semiconductor package-integrated capacitor cell embodiment depicted in FIG. 2. The processor 510 may also be coupled to a wireless antenna 578 to communicate with any device configured to at least one of transmit and receive wireless signals. In an embodiment, the wireless antenna interface 578 operates in accordance with, but is not limited to, the IEEE 802.11 standard and its related family, Home Plug AV (HPAV), Ultra Wide Band (UWB), Bluetooth, WiMax, or any form of wireless communication protocol.

In an embodiment, the volatile memory 532 includes, but is not limited to, Synchronous Dynamic Random-Access Memory (SDRAM), Dynamic Random-Access Memory (DRAM), RAMBUS Dynamic Random-Access Memory (RDRAM), and/or any other type of random access memory device. The non-volatile memory 534 includes, but is not limited to, flash memory, phase change memory (PCM), read-only memory (ROM), electrically erasable programmable read-only memory (EEPROM), or any other type of non-volatile memory device.

The memory 530 stores information and instructions to be executed by the processor 510. In an embodiment, the memory 530 may also store temporary variables or other intermediate information while the processor 510 is executing instructions. In the illustrated embodiment, the chipset 520 connects with processor 510 via Point-to-Point (PtP or P-P) interfaces 517 and 522. Either of these PtP embodiments may be achieved using a semiconductor package-integrated capacitor cell embodiment as set forth in this disclosure. The chipset 520 enables the processor 510 to connect to other elements in a semiconductor package-integrated capacitor cell embodiment in a system 500. In an embodiment, interfaces 517 and 522 operate in accordance with a PtP communication protocol such as the Intel® QuickPath Interconnect (QPI) or the like. In other embodiments, a different interconnect may be used.

In an embodiment, the chipset 520 is operable to communicate with the processor 510, 505N, the display device 540, and other devices 572, 576, 574, 560, 562, 564, 566, 577, etc. The chipset 520 may also be coupled to a wireless antenna 578 to communicate with any device configured to at least do one of transmit and receive wireless signals.

The chipset 520 connects to the display device 540 via the interface 526. The display 540 may be, for example, a liquid crystal display (LCD), a plasma display, cathode ray tube (CRT) display, or any other form of visual display device. In an embodiment, the processor 510 and the chipset 520 are merged into a semiconductor package-integrated capacitor cell embodiment in a system. Additionally, the chipset 520 connects to one or more buses 550 and 555 that interconnect various elements 574, 560, 562, 564, and 566. Buses 550 and 555 may be interconnected together via a bus bridge 572 such as at least one semiconductor package-integrated capacitor cell embodiment. In an embodiment, the chipset 520, via interface 524, couples with a non-volatile memory 560, a mass storage device(s) 562, a keyboard/mouse 564, a network interface 566, smart TV 576, and the consumer electronics 577, etc.

In an embodiment, the mass storage device 562 includes, but is not limited to, a solid-state drive, a hard disk drive, a universal serial bus flash memory drive, or any other form of computer data storage medium. In one embodiment, the network interface 566 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 5 are depicted as separate blocks within the semiconductor package, integrated capacitor cell embodiments in a computing system 500, the functions performed by some of these blocks may be integrated within a single semiconductor circuit or may be implemented using two or more separate integrated circuits. For example, although cache memory 516 is depicted as a separate block within processor 510, cache memory 516 (or selected aspects of 516) can be incorporated into the processor core 512.

To illustrate the semiconductor package-integrated capacitor cell embodiments and methods disclosed herein, a non-limiting list of examples is provided herein:

Example 1 is a capacitor cell, comprising: a semiconductor package substrate portion; a first capacitor plate in the semiconductor package substrate portion, wherein the first capacitor plate is part of a first plated recess; a dielectric material contacting the first capacitor plate, wherein the dielectric material is an integral and homogenous region of the semiconductor package substrate portion; a second capacitor plate in the semiconductor package substrate portion, wherein the subsequent capacitor plate is part of an adjacent and subsequent plated recess, and wherein the dielectric material also contacts the second capacitor plate.

In Example 2, the subject matter of Example 1 optionally includes wherein the first capacitor plate and the second capacitor plate are each portions of adjacent metal-plated troughs across the dielectric material.

In Example 3, the subject matter of any one or more of Examples 1-2 optionally include wherein the capacitor cell is one of two or more capacitor cells within the semiconductor package substrate portion.

In Example 4, the subject matter of any one or more of Examples 1-3 optionally include In Example 5, the subject matter of any one or more of Examples 1-4 optionally include wherein the capacitor cell is vertically stacked and coupled to a capacitor cell in an adjacent semiconductor package substrate portion.

In Example 6, the subject matter of any one or more of Examples 1-5 optionally include wherein the capacitor cell is coupled to a semiconductive device, wherein the semiconductor package substrate portion is part of a semiconductor package substrate, further including: a board coupled to the semiconductor package substrate.

In Example 7, the subject matter of any one or more of Examples 1-6 optionally includes a filler material selected from the group consisting of alumina ($Al_2O_3$), a non-stoichiometric solid solution of alumina ($Al_xO_y$), lead titanium zirconate ($PbTi_{1-x}Zr_xO_3$), a non-stoichiometric solid solution of lead titanium zirconate, lithium niobate ($LiNbO_3$), a non-stoichiometric solid solution of lithium niobite ($Li_xNb_yO_3$), strontium titanate ($SrTiO_3$), a non-stoichiometric solid solution of strontium titanate ($Sr_xTi_yO_3$), is strontium zirconate ($SrZrO_3$), a non-stoichiometric solid solution of strontium zirconate ($Sr_xZr_yO_3$), aluminum nitride (AlN), a non-stoichiometric solid solution of aluminum nitride ($Al_xN_y$), and combinations thereof.

In Example 8, the subject matter of any one or more of Examples 1-7 optionally includes a filler material selected from the group consisting of alumina ($Al_2O_3$), a non-stoichiometric solid solution of alumina ($Al_xO_y$), lead titanium zirconate ($PbTi_{1-x}Zr_xO_3$), a non-stoichiometric solid solution of lead titanium zirconate, lithium niobate ($LiNbO_3$), a non-stoichiometric solid solution of lithium niobite ($Li_xNb_yO_3$), strontium titanate ($SrTiO_3$), a non-stoichiometric solid solution of strontium titanate ($Sr_xTi_yO_3$), is strontium zirconate ($SrZrO_3$), a non-stoichiometric solid solution of strontium zirconate ($Sr_xZr_yO_3$), aluminum nitride (AlN), a non-stoichiometric solid solution of aluminum nitride ($Al_xN_y$), and combinations thereof; and wherein the filler material occupies the semiconductor package substrate portion in a range up to 60 volume percent.

Example 9 is a process of forming a semiconductor package-integrated capacitor cell, comprising: opening two adjacent recesses in a semiconductor package substrate portion, wherein the semiconductor package substrate portion includes a filler material, and under conditions to expose some of the filler material within the recesses; and electroless plating the recesses with capacitor-plate material under conditions that uses the filler material as an electroless plating catalyst.

In Example 10, the subject matter of Example 9 optionally includes wherein opening the two adjacent recesses includes laser-drilling, under conditions where the exposed filler material is catalyst activated.

Example 11 is a capacitor cell, comprising: a semiconductor package substrate portion; a first capacitor plate, wherein the first capacitor plate is a first partial right cylinder; a first electrode and a first trace, wherein the first electrode contacts the first trace, wherein the first trace contacts the first capacitor plate, and wherein the semiconductor package substrate portion contacts the first electrode, the first trace and the first capacitor plate; a dielectric material that contacts the first capacitor plate on a concave portion of the partial right cylinder; a second capacitor plate, wherein the second capacitor plate is part of an adjacent second partial right cylinder; and a second electrode and a second trace, wherein the second electrode contacts the second trace, wherein the second trace contacts the second capacitor plate, and wherein the semiconductor package substrate portion contacts the second electrode, the second trace and the adjacent second partial right cylinder.

In Example 12, the subject matter of Example 11 optionally includes wherein the dielectric material also contacts the adjacent second capacitor plate on a concave portion of the adjacent second partial right cylinder.

In Example 13, the subject matter of any one or more of Examples 11-12 optionally include wherein the first capacitor plate and the adjacent second capacitor plate are part of a single breached right cylinder.

In Example 14, the subject matter of any one or more of Examples 11-13 optionally include wherein the dielectric material is a first dielectric material, further including a second dielectric material, where the second dielectric material contacts the adjacent second capacitor plate on a concave portion of the adjacent second partial right cylinder.

In Example 15, the subject matter of any one or more of Examples 11-14 optionally include wherein the first capacitor plate and the adjacent second capacitor plate are part of two adjacent breached right cylinders.

In Example 16, the subject matter of any one or more of Examples 11-15 optionally include wherein the capacitor cell is one of two or more capacitor cells within the semiconductor package substrate portion.

In Example 17, the subject matter of any one or more of Examples 11-16 optionally include In Example 18, the subject matter of any one or more of Examples 11-17 optionally include wherein the capacitor cell is vertically stacked and coupled to a capacitor cell in an adjacent semiconductor package substrate portion.

In Example 19, the subject matter of any one or more of Examples 11-18 optionally include wherein the capacitor cell is coupled to a semiconductive device, wherein the semiconductor package substrate portion is part of a semiconductor package substrate, further including: a board coupled to the semiconductor package substrate.

Example 20 is a process of forming a semiconductor package-integrated capacitor cell, comprising: opening a recess through an interlayer dielectric and partially in a semiconductor package substrate portion, and under conditions to expose a first trace and a second trace; plating the recess under conditions to contact the first trace and the second trace, wherein plating forms a right cylinder; breaching the right cylinder to form two adjacent partial right-cylinders; and contacting at least one of the partial right-cylinders with a plug dielectric material.

In Example 21, the subject matter of Example 20 optionally includes wherein breaching forms two breaches, further including filling the breaches with a dielectric material.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electrical device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the disclosed embodiments should be determined with reference to the appended claims, along with the full scope of equivalents to which such claims are entitled.

The invention claimed is:

1. A capacitor cell, comprising:
a semiconductor dielectric package substrate portion:
a first capacitor plate in the semiconductor dielectric package substrate portion, wherein the first capacitor plate is part of a first plated recess;
a dielectric material contacting the first capacitor plate, wherein the dielectric material is an integral and homogenous region of the semiconductor dielectric package substrate portion, wherein the dielectric material includes a filler material; and
a second capacitor plate in the semiconductor dielectric package substrate portion, wherein the second capacitor plate is part of an adjacent and subsequent plated recess, and wherein the dielectric material also contacts the second capacitor plate.

2. The capacitor cell of claim 1, wherein the first capacitor plate and the second capacitor plate are each portions of adjacent metal-plated troughs across the dielectric material.

3. The capacitor cell of claim 1, wherein the capacitor cell is one of two or more capacitor cells within the semiconductor dielectric package substrate portion.

4. The capacitor cell of claim 1, wherein the capacitor cell is one of two or more capacitor cells within the semiconductor dielectric package substrate portion, in a density range from 2 to 50 capacitor cells/cm$^2$.

5. The capacitor cell of claim 1, wherein the capacitor cell is vertically stacked and coupled to a capacitor cell in an adjacent semiconductor dielectric package substrate portion.

6. The capacitor cell of claim 1, wherein the capacitor cell is a first capacitor cell that is vertically stacked and coupled to a subsequent capacitor cell in an adjacent semiconductor dielectric package substrate portion, and wherein the subsequent capacitor cell includes:
a first capacitor plate in the semiconductor dielectric package substrate portion, wherein the first capacitor plate is part of a first, plated recess;
a dielectric material contacting the first capacitor plate, wherein the dielectric material is an integral and homogenous region of the semiconductor dielectric package substrate portion; and
a second capacitor plate in the semiconductor dielectric package substrate portion, wherein the second capacitor plate is part of an adjacent and subsequent plated recess, and wherein the dielectric material also contacts the second capacitor plate.

7. The capacitor cell of claim 6, wherein the first capacitor cell is in a die-side semiconductor dielectric package substrate portion.

8. The capacitor cell of claim 6, wherein the first capacitor cell is in a land-side semiconductor dielectric package substrate portion.

9. The capacitor cell of claim 1, wherein the capacitor cell is coupled to a semiconductive device, wherein the semiconductor dielectric package substrate portion is part of a semiconductor dielectric package substrate, further including:
a board coupled to the semiconductor dielectric package substrate.

10. The capacitor cell of claim 1, wherein the capacitor cell is coupled to a semiconductive device, and wherein the semiconductor dielectric package substrate portion is part of a semiconductor dielectric package substrate.

11. The capacitor cell of claim 1, wherein the filler material is selected from a group consisting of alumina ($Al_2O_3$), a non-stoichiometric solid solution of alumina ($Al_xO_y$), lead titanium zirconate ($PbTi_{1-x}Zr_x(O_3)$), a non-stoichiometric solid solution of lead titanium zirconate, lithium niobate ($LiNbO_3$), a non-stoichiometric solid solution of lithium niobite ($Li_xNb_yO_3$), strontium titanate ($SrTiO_3$), a non-stoichiometric solid solution of strontium titanate ($Sr_xTi_yO_3$), is strontium zirconate ($SrZrO_3$), a non-stoichiometric solid solution of strontium zirconate ($Sr_xZr_yO_3$), aluminum nitride (AlN), a non-stoichiometric solid solution of aluminum nitride ($Al_xN_y$), and combinations thereof.

12. The capacitor cell of claim 1, wherein the filler material is selected from a group consisting of alumina ($Al_2O_3$), a non-stoichiometric solid solution of alumina ($Al_xO_y$), lead titanium zirconate ($PbTi_{1-x}Zr_xO_3$), a non-stoichiometric solid solution of lead titanium zirconate, lithium niobate ($LiNbO_3$), a non-stoichiometric solid solution of lithium niobite ($Li_xNb_yO_3$), strontium titanate ($SrTiO_3$), a non-stoichiometric solid solution of strontium titanate ($Sr_xTi_yO_3$), is strontium zirconate ($SrZrO_3$), a non-stoichiometric solid solution of strontium zirconate ($Sr_xZr_yO_3$), aluminum nitride (AlN), a non-stoichiometric solid solution of aluminum nitride ($Al_xN_y$), and combinations thereof; and
wherein the tiller material occupies the semiconductor dielectric package substrate portion in a range up to 60 volume percent.

\* \* \* \* \*